United States Patent [19]

Patrick et al.

[11] 4,010,064
[45] Mar. 1, 1977

[54] CONTROLLING THE OXYGEN CONTENT OF CZOCHRALSKI PROCESS OF SILICON CRYSTALS BY SANDBLASTING SILICA VESSEL

[75] Inventors: William John Patrick, Poughkeepsie; Salvatore James Scilla, Marlboro; Wolfgang Alfred Westdorp, Hopewell Junction, all of N.Y.

[73] Assignee: International Business Machines Corporation, Armonk, N.Y.

[22] Filed: May 27, 1975

[21] Appl. No.: 581,307

[52] U.S. Cl. .................. 156/617 SP; 156/DIG. 64; 156/DIG. 83; 23/273 SP
[51] Int. Cl.² ..................... B01J 17/18; C01B 33/02
[58] Field of Search ............... 156/617 SP, DIG. 64, 156/608, 616, DIG. 83; 23/273 SP, 273 Z

[56] References Cited

UNITED STATES PATENTS

| | | | |
|---|---|---|---|
| 3,173,765 | 3/1965 | Gobat | 156/617 SP |
| 3,520,810 | 7/1970 | Plaskett | 156/616 A |

FOREIGN PATENTS OR APPLICATIONS

| | | | |
|---|---|---|---|
| 658,110 | 12/1965 | Belgium | 156/617 SP |
| 797,377 | 7/1958 | United Kingdom | 156/617 SP |

OTHER PUBLICATIONS

Lawson et al., *Preparation of Single Crystals*, London, Butterworths Sci. Pub., 1958, pp. 125–129.
Hartman et al., *Metal Progress*, Oct. 1956, pp. 100–103.
Dash, *Journal of App. Phy.*, vol. 29, No. 4, Apr. 1958, pp. 736 and 737.
Hannay, *Semi–Conductors*, Monograph Series No. 140, 1960, pp. 107–110.

*Primary Examiner*—Stephen J. Emery
*Attorney, Agent, or Firm*—David M. Bunnell

[57] ABSTRACT

The oxygen content of silicon crystals, which are drawn from a silicon melt contained in a silica vessel according to the Czochralski process, is controlled by changing the surface characteristics of the portion of the silica vessel which is in contact with the melt so as to provide an increased oxygen concentration in the melt during the crystal drawing process.

2 Claims, No Drawings

CONTROLLING THE OXYGEN CONTENT OF CZOCHRALSKI PROCESS OF SILICON CRYSTALS BY SANDBLASTING SILICA VESSEL

BACKGROUND OF THE INVENTION

This invention relates generally to a crystal growing method and more particularly to a crystal growing method for growing single crystals of material such as silicon in which the oxygen content of the crystals is controlled.

The production of single crystals from materials such as silicon plays an important role in semiconductor technologies. A suitable method for growing the crystals is known as the Czochralski technique in which a seed crystal which has the desired crystal orientation, is introduced into a melt of the semiconductor material. The melt can also contain certain dopants which are introduced for the purpose of modifying the electrical characteristics of the semiconductor material as is known in the art. The melt is contained in a silica crucible or vessel which is heated so that the semiconductor melt is at or slightly above its melting point. The seed crystal is slowly withdrawn from the melt, in an inert atmosphere such as argon, and the semiconductor material solidifies on the seed to produce the growth of a single crystal. A cylindrical crystal is produced by rotating the crystal as it is drawn. Conventionally, the withdrawing rate and power to the heating means is greater at first in order to cause a neck down of the crystal which reduces dislocations caused by the thermal shock which occurs when the seed crystal initially contacts the melt. The withdrawing rate is then decreased and the power is reduced in order to cause the diameter of the crystal to increase in a cone shaped manner until the desired crystal diameter is reached. The withdrawal rate and heating is then maintained constant until close to the end of the process where again the rate and heating is increased so that the diameter decreases to form a cone and neck portion at the end.

At the melt temperature of silicon (about 1,400° C), the surface of the silica crucible which is in contact with the melt dissolves and forms silicon monoxide, SiO, which enters the melt and evaporates from the surface of the melt. The SiO is a source of oxygen which enters the melt and, consequently the drawn crystal. Heretofore, the presence of oxygen in the crystal has been generally regarded as an undesirable impurity. It is also found that the oxygen concentration in the crystal is not constant but varies from the seed end, where it is at the highest level, to the tail end of the crystal where it is at its lowest level. Initially, the oxygen content of the melt is in the order of $3\times10^{18}$ atoms per cubic centimeter which is about the saturation point. The oxygen in the grown crystal ranges from about $1.5\times10^{18}$ atoms/cc in the seed down to around $6\times10^{17}$ atoms/cc at the tail. From this it is apparent that the oxygen content of the melt is depleted during the crystal growing process, probably due to a lower dissolution rate of the crucible as the process continues.

It has recently been found that the presence of oxygen can have beneficial effects on the properties of semiconductor devices manufactured from the grown crystals. For example, a reduction in leakage currents is noted at higher oxygen levels. Accordingly, it has been found that the observed beneficial effect on leakage occurs primarily with devices made from semiconductor wafers cut from the seed end of the crystal which has the higher oxygen contents. Therefore, it is desirable to be able to reduce the oxygen concentration gradient through the length of the crystal so that the same beneficial effects on the yield of devices will be obtained whether the semiconductor wafers used in making the devices are cut from the seed or the tail end of the crystal. We have now found a process to both increase the oxygen level in the crystals and to control the seed to tail oxygen concentration gradient. The oxygen concentration can either be made more uniform or it can be tailored to a desired gradient.

SUMMARY OF THE INVENTION

In accordance with this invention a process is provided for controlling the oxygen content of silicon crystals which are drawn from a melt of silicon contained in a silica vessel comprising treating the vessel to change the surface characteristics of the portion of the vessel which is in contact with the melt so as to control the oxygen content of the melt during the crystal growing process.

In one embodiment of the invention the surface of the vessel is roughened such as, by sand blasting.

In another embodiment of the invention the surface of the vessel is subjected to a heat treatment such as, by fire polishing or annealing in an oven.

DETAILED DESCRIPTION

The foregoing and other objects, features and advantages of the invention will be apparent from the following more particular description of the preferred embodiments of the invention.

As described above, a commonly used method for the growth of single crystals of semiconductor material such as silicon is the well known Czochralski method in which a charge of very pure silicon, from which the single crystal is to be grown, is placed in a crucible. The surface of the crucible which is in contact with the semiconductor melt is highly pure silica. Such crucibles of highly pure silica are commercially available. Alternatively, silica lined vessels such as a silica lined graphite crucible can be employed. If a doping impurity is to be added to the crystal, it is added to the charge of silicon. The crucible containing the charge is placed in a controlled inert atmosphere, such as argon. Carbon resistance heaters or RF induction coils which encircle the crucible, introduce heat and cause the charge temperature to be stabilized to just above the melting point of the semiconductor material. A seed crystal, which is a small, highly perfect and oriented crystal of the semiconductor material is attached to the end of a pulling rod. An example of a typical seed crystal is a square rod of silicon of about ¼ inch in diameter and about 3 inches long. The pulling rod is actuated by a conventional crystal pulling mechanism which controls its upward movement at a selected uniform rate such as from about ¼ to 4 inches per hour. The seed crystal is lowered into the molten semiconductor and is permitted to partially melt in order to remove any surface imperfections. The seed is then slowly withdrawn from the melt and rotated while it is being withdrawn so that a cylindrical crystal is produced. The drawing rate and heating of the charge is made higher initially in order to minimize the dislocation effects which occur when the seed is first introduced into the molten semiconductor material. After this so called necked down portion is formed, the drawing rate and power to the heating coils are lowered until the desired crystal diameter of from about 1 to 3 inches, is obtained. This diameter is then maintained until close to the end of the crystal drawing process. Typically a 12 to 16 inch long crystal is produced. Standard silicon charges weigh about 3.5 Kg.

After the crystal has been grown it is sawed into thin slices, commonly referred to as wafers, which are, after thining and polishing, then subjected to conventional series of epitaxy, masking, diffusion, and metallization steps required to produce desired micro electronic components or integrated circuits.

The crystal is of a high purity silicon containing any dopants which are introduced for the purpose of modifying the properties of the semiconductor material. It has been found that the crystals contain from about $1.5 \times 10^{18}$ down to $6 \times 10^{17}$ atoms/cc of oxygen as an impurity. The oxygen results from the contact of the hot melt with the silica surface of the crucible which forms silicon monoxide and introduces oxygen into the melt. It is believed that initially the oxygen content in the melt is about at saturation or about $3 \times 10^{18}$ atoms/cc of oxygen. The concentration of oxygen apparently decreases during the crystal pulling process due to a lower dissolution rate of the crucible surface. This lower effective dissolution rate is attributed to the passivating effect of silicon monoxide layers which form on the crucible walls and protect it to some extent from further attack by the molten semiconductor.

The crucibles employed in the embodiment of the invention described in the example are high purity silica and are transparent, cylindrical shaped vessels having a diameter in the magnitude of about 6 inches and a thickness of about 0.1 inch.

According to the process of the invention, the surface of the crucible which is in contact with the semiconductor material is treated in a manner that results in an increase in the oxygen content of the drawn crystal. Suitable procedures for obtaining this effect include the roughening of the inner surface of the crucible by contact with an abrasive material such as by sand blasting and the heating of the silica crucible by either an annealing process in a furnace or preheating in the crystal puller. The effect can also be produced by flame fire polishing the surface with a conventional oxygen-hydrogen flame such as is employed in glass blowing.

The abrasive roughening treatment is conveniently carried out using commercially available sand blasting equipment such as marketed by S. S. White Co. The equipment produces a stream of an abrasive such as, for example, alumina in a carrier gas which is impinged on the inner surfaces of the crucible. The treating parameters are not particularly critical but the treatment should be such that the treated portions are roughened and become opaque. A few minutes is sufficient to sand blast the inner surface of the average size crucible. Treating the entire surface of the crucible which is in contact with the melt has been found to produce both increased and more uniform oxygen concentrations from the seed to the tail end of the crystal. The tailoring of the oxygen concentration in the crystal to a desired level of oxygen and to a desired concentration profile from the seed to the tail end of the crystal can be obtained by varying the area of the crucible surface which is treated. This is accomplished, for example, by masking a portion of the crucible with tape so that it is protected from the abrasive.

It has also been found that treating the crucible at high temperatures such as from about 1,100° to 1,300° C in an oven for times of about one hour or by fire polishing the inner surface with a flame until the initially observable white devitrification of the surface is observed to disappear also will provide a generally increased oxygen content in the drawn crystal. Hydrofluoric acid-nitric acid etch treatments have not been found to significantly change the oxygen concentration in the crystal.

After the crystal growing process was completed, an examination of the treated crucible surfaces showed that they were relatively smooth and were not covered with SiO layers which normally form on untreated surfaces which are in contact with the melt.

The results which can be obtained by the process of the invention are further illustrated by the following examples.

EXAMPLE 1

Identical charges of high purity silicon were placed in high purity silica crucibles and heated to melt the charges. Silicon seed crystal rods approximately 3 inches long and ¼ inch square having a 1,0,0 crystal lattice orientation were introduced into the melts and the crystals were slowly withdrawn from the melt to give first a reduction in diameter to about 1/16 of an inch after which a cone shaped portion was drawn with rotation of the drawing rod until crystals of about 2¼ inches in diameter were obtained. This diameter was maintained constant to near the end of the growth where a second cone shaped portion is produced to complete the crystals. The crystals had a length of about 12 inches. As recorded in Table I below, one crucible was not subjected to any treatment and acted as a control. One crucible was subjected to a conventional nitric hydrofluoric acid etch for 5 minutes and the remaining 4 crucibles had either all or one-half of their inner surface sand blasted.

Table I

| Crystal | Crucible Treatment | Oxygen Atoms/cc Seed | Tail |
| --- | --- | --- | --- |
| Control | None | $14 \times 10^{17}$ | $7 \times 10^{17}$ |
| 1 | HF-HNO$_3$ Etch 5 Min. | $12 \times 10^{17}$ | $9.9 \times 10^{17}$ |
| 2 | 50% Sandblasted Strips | $18.9 \times 10^{17}$ | $10.4 \times 10^{17}$ |
| 3 | 50% Sandblasted Strips | $17.6 \times 10^{17}$ | $11.0 \times 10^{17}$ |
| 4 | 50% Sandblasted Strips | $18.8 \times 10^{17}$ | $9.9 \times 10^{17}$ |
| 5 | Entire Surface Sandblasted | $18.1 \times 10^{17}$ | $17.2 \times 10^{17}$ |

The oxygen content of the silicon crystal was determined by analyzing portions cut from the seed and tail end of the crystal. The analysis was done by infrared absorption spectroscopy.

It can be seen from the results shown in Table I that the crystals grown from the sandblasted silica crucibles gave consistently higher oxygen levels than either the untreated or the acid etched crucibles. It is apparent, then, that it is not sufficient for a treatment to simply remove a surface layer from the crucible. An examination of the sandblasted crucible surface after the crystal growth showed no build up of normally observed passivating platelets of SiO. The dissolution rate of the oxygen, particularly in the completely sandblasted, crucible was apparently quite uniform. The conclusion from the above results is that the sandblasting process caused the dissolution rate from the crucible surface to be more uniform throughout the run. The amount of oxygen in the tail portion was reduced when only 50 percent of the surface was sandblasted. Accordingly, the sandblasting of different patterns into the crucible bottom and walls to change the ratio of treated and untreated areas permits the tailoring of the oxygen profiles which are obtained in the crystal.

EXAMPLE 2

As an example of the heat treatment embodiment of the invention, silicon crystals were drawn from a melt as described in example 1 with the crucibles being either heated, annealed or fire polished as described in Table II below. Best results were obtained at temperatures of 1,300° and above although some effect was noted in annealing at a temperature of 1,140° C. Treatment times were in the order of magnitude of about an hour.

Table II

| Crystal | Crucible Treatment | Oxygen Atoms/cc Seed | Tail |
|---|---|---|---|
| Control | None | $14 \times 10^{17}$ | $7 \times 10^{17}$ |
| 1 | Heat in Puller 1 hr. at 1300–1350° C | $20.1 \times 10^{17}$ | $10.8 \times 10^{17}$ |
| 2 | Annealed in Oven 50 min. at 1140° C | $17.4 \times 10^{17}$ | $10.1 \times 10^{17}$ |
| 3 | Fire Polished | $15.1 \times 10^{17}$ | $12.0 \times 10^{17}$ |
| 4 | Fire Polished (small torch) | $14.4 \times 10^{17}$ | $11.6 \times 10^{17}$ |
| 5 | Fire Polished | $19.1 \times 10^{17}$ | $13.1 \times 10^{17}$ |

It can be seen from the data in Table II that the heat or fire polishing treatment also tends to shift the oxygen content of the crystal so as to increase it at both the seed and tail end with a gradual decrease of oxygen to the tail portion. It also appears that the heating time and temperature and the extent of the fire polishing treatment can be used to tailor the oxygen concentration. The parameters required to obtain any desired concentration can be easily determined experimentally.

The foregoing invention has described a process whereby the oxygen content of high purity silicon single crystals can be tailored for any desired application. The oxygen content can be maintained at a higher and constant level from the seed to the tail end of a crystal so that the portion of the crystal from which a wafer is cut no longer has to be considered with respect to possible effects on device yield.

While the invention has been particularly shown and described with reference to preferred embodiments thereof, it will be understood by those skilled in the art that the foregoing and other changes in form and details may be made therein without departing from the spirit and scope of the invention.

We claim:

1. A process for increasing the oxygen content and reducing the oxygen concentration gradient through the length of a silicon crystal, which is drawn from a silicon melt contained in a silica vessel according to the Czochralski process, comprising: treating said vessel to change the characteristics of the silica surface which is in contact with said melt by roughening said surface by sandblasting until said surface becomes opaque, so as to provide a more uniform dissolution rate of said silica surface by said melt during the crystal growing process.

2. A process for increasing and tailoring through the length of a silicon crystal the oxygen content and producing a decreased oxygen content gradient through the length of the silicon crystal, which is drawn from a silicon melt contained in a silica vessel according to the Czochralski process, comprising: treating a portion of from about 50% to the entire silica surface which is in contact with the melt by roughening said portion of said surface by sandblasting until said portion become opaque, so as to provide a more uniform dissolution rate of said portion by said melt during the crystal growing process.

* * * * *